United States Patent
Liang et al.

(10) Patent No.: US 10,361,154 B2
(45) Date of Patent: Jul. 23, 2019

(54) VARIABLE INDUCTOR AND INTEGRATED CIRCUIT USING THE VARIABLE INDUCTOR

(71) Applicant: NATIONAL CHUNG SHAN INSTITUTE OF SCIENCE AND TECHNOLOGY, Taoyuan (TW)

(72) Inventors: Chia-Jen Liang, Kaohsiung (TW); Yen-Cheng Kuan, Kaohsiung (TW); Ching-Wen Chiang, Chiayi (TW); Chien-Te Yu, Taoyuan (TW)

(73) Assignee: NATIONAL CHUNG SHAN INSTITUTE OF SCIENCE AND TECHNOLOGY (TW)

( * ) Notice: Subject to any disclaimer, the term of this patent is extended or adjusted under 35 U.S.C. 154(b) by 84 days.

(21) Appl. No.: 15/848,026

(22) Filed: Dec. 20, 2017

(65) Prior Publication Data

US 2019/0189556 A1  Jun. 20, 2019

(51) Int. Cl.
*H01F 21/12* (2006.01)
*H01L 23/522* (2006.01)
*H01L 27/07* (2006.01)

(52) U.S. Cl.
CPC ......... *H01L 23/5227* (2013.01); *H01F 21/12* (2013.01); *H01L 27/0705* (2013.01)

(58) Field of Classification Search
CPC .......................... H01F 27/00–36; H01F 27/12
USPC ......................... 336/65, 200, 232; 257/531
See application file for complete search history.

(56) References Cited

U.S. PATENT DOCUMENTS

| | | | | |
|---|---|---|---|---|
| 7,460,001 B2 * | 12/2008 | Jessie | ................. | H01F 17/0006 257/E27.046 |
| 8,441,334 B2 * | 5/2013 | Kawano | ................. | H01F 21/02 336/200 |
| 9,520,220 B2 * | 12/2016 | Yen | .......................... | H01F 21/12 |
| 2002/0158711 A1 * | 10/2002 | Groves | .................. | H03H 5/006 333/174 |
| 2010/0060370 A1 * | 3/2010 | Chen | ...................... | H03K 3/354 331/117 FE |
| 2013/0140672 A1 * | 6/2013 | Sato | ..................... | H01L 23/5227 257/531 |

* cited by examiner

*Primary Examiner* — Tuyen T Nguyen
(74) *Attorney, Agent, or Firm* — Schmeiser, Olsen & Watts, LLP

(57) ABSTRACT

A variable inductor which comprises a primary conductor, first and second secondary conductors and one or more switch. The primary conductor has a first node and a second node, wherein the first node is used to connect a first external component and the second node is used to connect a second external component. The first and second secondary conductors magnetically couple to the primary conductor. The one or more switch has two sides connected to the first or second secondary conductor, respectively. The first and second secondary conductors are formed a single-loop structure with two or more changeable current paths which are operated by the states of the one or more switch. An integrated circuit using the variable inductor is also introduced.

8 Claims, 13 Drawing Sheets a first node and a second node. The first node is used to connect a first external component and the second node is used to connect a second external component. The first secondary conductor magnetically couples to the primary conductor. The first switch has two sides connected to the first secondary conductor, respectively. The first secondary conductor is formed a single-loop structure with two changeable current paths which are operated by the states of the first switch.

VARIABLE INDUCTOR AND INTEGRATED CIRCUIT USING THE VARIABLE INDUCTOR

FIELD OF THE INVENTION

The present disclosure relates to a variable inductor and, more particularly, to a variable inductor which can be formed on an integrated circuit.

BACKGROUND OF THE INVENTION

Referring to FIG. 1A and FIG. 1B, FIG. 1A and FIG. 1B shows a conventional variable inductor. The conventional variable inductor 1000 has a primary conductor 1100 and a secondary conductor 1200, a switch 1300 and a current source 1400. The secondary conductor 1200 forms a loop on the outside of the primary conductor 1100. The switch 1300 couples in series with the secondary conductor 1200 and is turned on or off to make the loop close or open. The inductance of the conventional variable inductor 1000 is varied by closing and opening the loop with the switch 1300. The current source 1400 is also coupled in series with the secondary conductor 1200 and used to control the current flow in the secondary conductor 1200 to either increase or decrease the inductance.

Referring to FIG. 2, FIG. 2 shows another one conventional variable inductor. The conventional variable inductor 2000 has a first conductor 2100, a second conductor 2200, a first switch 2300, a second switch 2400 and a third switch 2500. The first switch 2300, the second switch 2400 and the third switch 2500 are disposed on three current paths connected between the first conductor 2100 and the second conductor 2200, respectively. The inductance of the conventional variable inductor 2000 is varied by closing and opening the first switch 2300, the second switch 2400 and the third switch 2500.

The conventional variable inductor 1000 may have a limitedly adjustable inductance range and an insufficient inductance resolution. The conventional variable inductor 2000 may have a lower Q value, durability issues and bias concern.

Accordingly, it is imperative to provide a variable inductor and an integrated circuit using the variable inductor which can overcome the aforesaid drawbacks of the conventional variable inductors.

SUMMARY OF THE INVENTION

In view of the aforesaid drawbacks of the prior art, it is an objective of the present disclosure to provide a variable inductor and an integrated circuit using the variable inductor which can have a wider adjustable inductance range, a better inductance resolution, a higher Q value, fewer durability issues and no bias concern.

In order to achieve the above and other objectives, the present disclosure provides a variable inductor which comprises a primary conductor, a first secondary conductor and a first switch. The primary conductor has a first node and a second node, wherein the first node being used to connect a first external component and the second node being used to connect a second external component. The first secondary conductor magnetically couples to the primary conductor. The first switch has two sides connected to the first secondary conductor, respectively. The first secondary conductor is formed a single-loop structure with two changeable current paths which are operated by the states of the first switch.

Regarding the variable inductor, the variable inductor further comprises a second switch having two sides connected to the first secondary conductor, respectively, and the first secondary conductor is formed a single-loop structure with four changeable current paths which are operated by the states of the first and second switches.

Regarding the variable inductor, the variable inductor further comprises a third switch having two sides connected to the first secondary conductor, respectively, and the first secondary conductor is formed a single-loop structure with eight changeable current paths which are operated by the states of the first, second and third switches.

Regarding the variable inductor, the variable inductor further comprises a second secondary conductor magnetically coupling to the primary conductor and a fourth switch having two sides connected to the second secondary conductor, respectively. The second secondary conductor is formed a single-loop structure with two changeable current paths which are operated by the states of the fourth switch.

Regarding the variable inductor, the variable inductor further comprises a fifth switch having two sides connected to the second secondary conductor, respectively, and the second secondary conductor is formed a single-loop structure with four changeable current paths which are operated by the states of the fourth and fifth switches.

Regarding the variable inductor, the variable inductor further comprises a sixth switch having two sides connected to the second secondary conductor, respectively, and the second secondary conductor is formed a single-loop structure with eight changeable current paths which are operated by the states of the fourth, fifth and sixth switches.

Regarding the variable inductor, the first secondary conductor is disposed on one side of the primary conductor and the second secondary conductor is disposed on another side of the primary conductor.

Regarding the variable inductor, the first node is on one end of the primary conductor and the second node is on another end of the primary conductor.

Regarding the variable inductor, the variable inductor is integrated in a radio frequency integrated circuit.

Regarding the variable inductor, the first switch is implemented by a CMOS (complementary metal oxide semiconductor) or PCB (printed circuit board) lump component.

In order to achieve the above and other objectives, the present disclosure provides an integrated circuit. The integrated circuit comprises a first component, a second component and a variable inductor. The variable inductor comprises a primary conductor, a first secondary conductor and a first switch. The primary conductor has a first node and a second node. The first node is used to connect a first external component and the second node is used to connect a second external component. The first secondary conductor magnetically couples to the primary conductor. The first switch has two sides connected to the first secondary conductor, respectively. The first secondary conductor is formed a single-loop structure with two changeable current paths which are operated by the states of the first switch.

Regarding the integrated circuit, the variable inductor further comprises a second switch having two sides connected to the first secondary conductor, respectively, and the first secondary conductor is formed a single-loop structure with four changeable current paths which are operated by the states of the first and second switches.

Regarding the integrated circuit, the variable inductor further comprises a third switch having two sides connected to the first secondary conductor, respectively, and the first secondary conductor is formed a single-loop structure with eight changeable current paths which are operated by the states of the first, second and third switches.

Regarding the integrated circuit, the variable inductor further comprises a second secondary conductor magnetically coupling to the primary conductor and a fourth switch having two sides connected to the second secondary conductor, respectively. The second secondary conductor is formed a single-loop structure with two changeable current paths which are operated by the states of the fourth switch.

Regarding the integrated circuit, the variable inductor further comprises a fifth switch having two sides connected to the second secondary conductor, respectively, and the second secondary conductor is formed a single-loop structure with four changeable current paths which are operated by the states of the fourth and fifth switches.

Regarding the integrated circuit, the variable inductor further comprises a sixth switch having two sides connected to the second secondary conductor, respectively, and the second secondary conductor is formed a single-loop structure with eight changeable current paths which are operated by the states of the fourth, fifth and sixth switches.

Regarding the integrated circuit, the first secondary conductor is disposed on one side of the primary conductor and the second secondary conductor is disposed on another side of the primary conductor.

Regarding the integrated circuit, the first node is on one end of the primary conductor and the second node is on another end of the primary conductor.

Regarding the integrated circuit, the integrated circuit is used for radio frequency.

Regarding the integrated circuit, the first switch is implemented by a CMOS (complementary metal oxide semiconductor).

In conclusion, give the aforesaid variable inductor and integrated circuit, the present disclosure feature a wider adjustable inductance range, a better inductance resolution, a higher Q value, fewer durability issues and no bias concern.

BRIEF DESCRIPTION OF THE DRAWINGS

Objectives, features, and advantages of the present disclosure are hereunder illustrated with specific embodiments in conjunction with the accompanying drawings.

DETAILED DESCRIPTION OF THE PREFERRED EMBODIMENTS

Figure 1A:
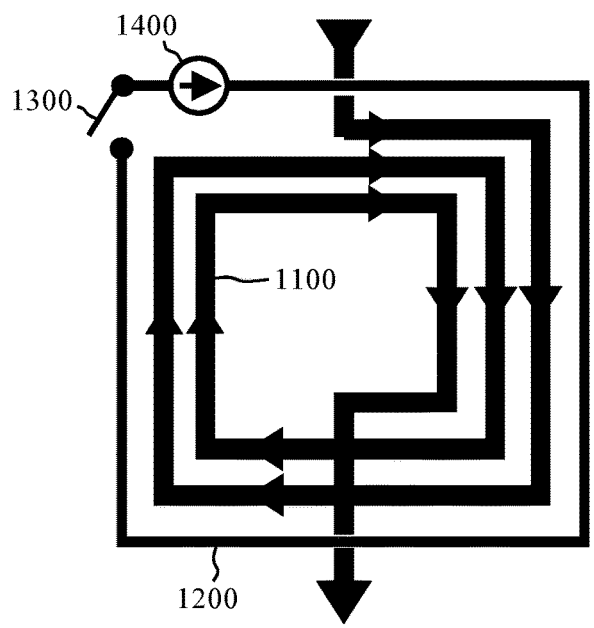
FIG. 1A shows a schematic diagram of a conventional variable inductor.
Figure 1B:
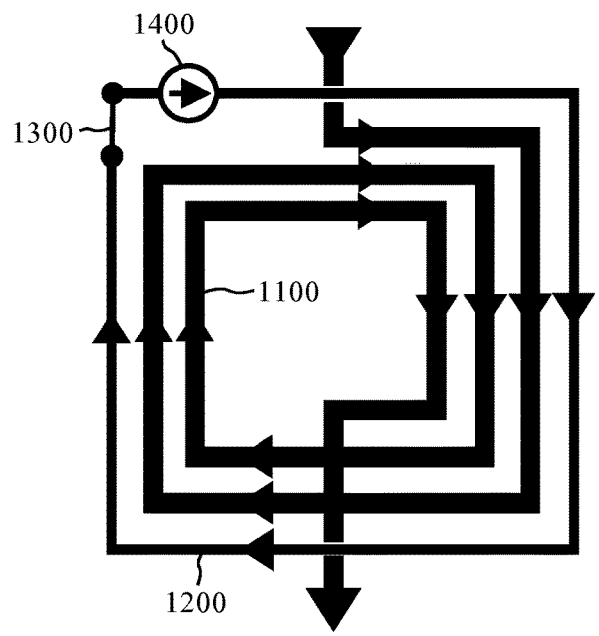
FIG. 1B shows a schematic diagram of a conventional variable inductor.
Figure 2:
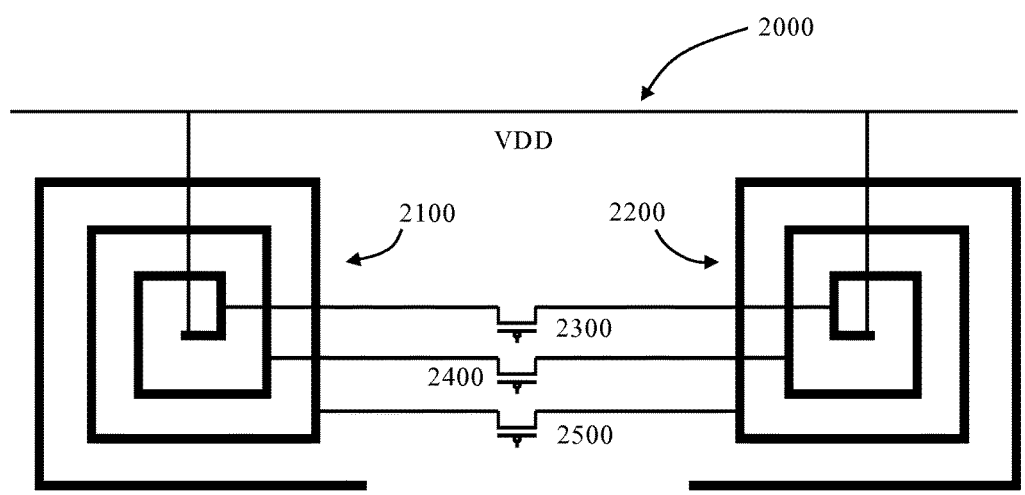
FIG. 2 shows a schematic diagram of another one conventional variable inductor.
Figure 3:
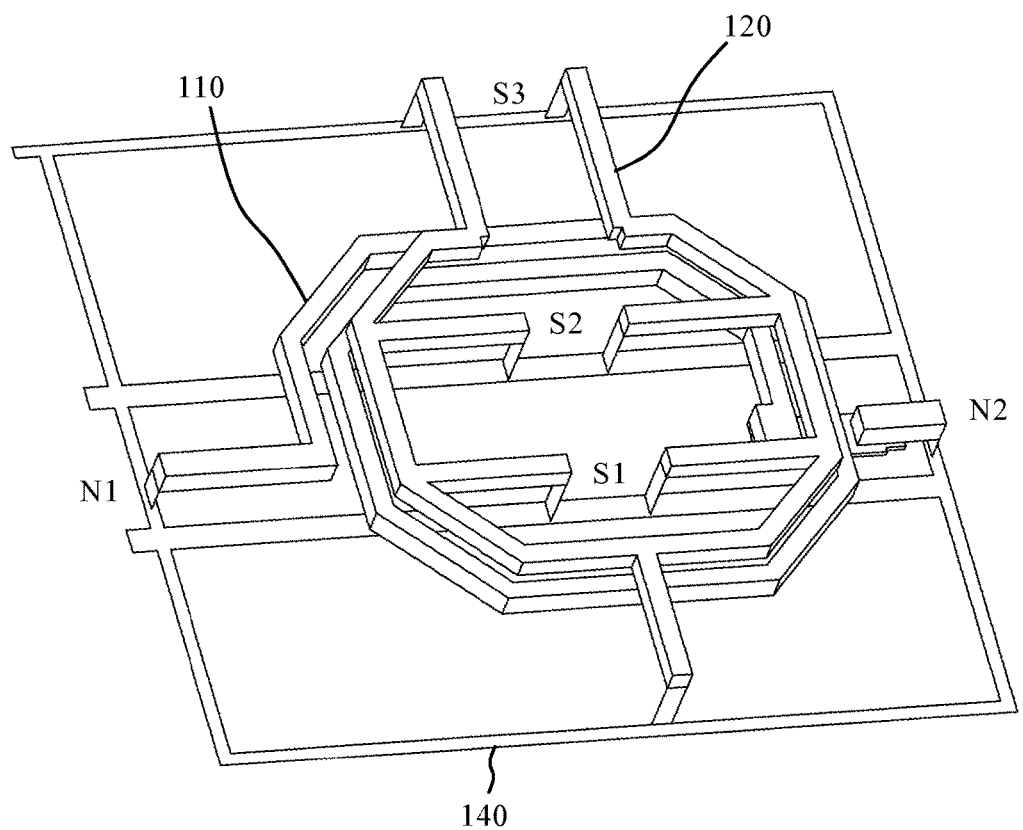
FIG. 3 is schematic diagrams of a variable inductor according to an embodiment of the present disclosure.

Referring to FIG. 3, FIG. 3 is schematic diagrams of a variable inductor according to an embodiment of the present disclosure. The variable inductor 100 has a primary conductor 110, a first secondary conductor 120, a first switch S1, a second switch S2 and a third switch S3, wherein the primary conductor 110 and the first secondary conductor 120 magnetically couple to each other to form a transformer structure. By controlling the first through third switches S1 through S3, the equivalent inductance of the first secondary conductor 120 and coupling factor are changed due to magnetic coupling theory of the transformer structure. The inductance value of the primary conductor 110 is changed as the equivalent inductance of the first secondary conductor 120 and coupling factor are changed. Therefore, the primary conductor 110, the first secondary conductor 120 and the first through third switches S1 through S3 can achieve the object of variable inductance.

In FIG. 3, the first secondary conductor 120 is disposed on the top of the primary conductor 110. The first switch S1, the second switch S2 and the third switch S3 can be implemented on a substrate or printed circuit board 140. The substrate or printed circuit board 140 can be disposed under the bottom of the primary conductor 110.

The first switch S1 has two sides connected to the first secondary conductor 120, respectively. The second switch S2 has two sides connected to the first secondary conductor 120, respectively. The third switch S3 has two sides connected to the first secondary conductor 120, respectively. The first switch S1, the second switch S2 and the third switch S3 are formed on current paths P1-P3, respectively.

The first secondary conductor 120 is formed a single-loop structure. The current paths P1-P3 are formed as three different bypaths of the single-loop structure. Therefore, if the state of anyone of the first switch S1, the second switch S2 and the third switch S3 are changed, then the current paths of the first secondary conductor 120 is changed.

Figure 4A:
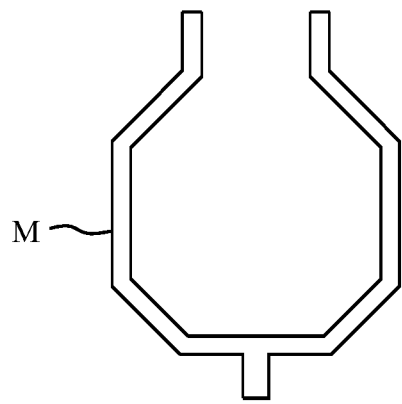
FIG. 4A is a plan view of different current paths of a first secondary conductor of the variable inductor according to an embodiment of the present disclosure.

FIGS. 4A through 4H show eight different current paths of the first secondary conductor 120. In FIG. 4A, all of the first switch S1, the second switch S2 and the third switch S3 operated to be open. The first secondary conductor 120 is formed a single-loop structure with a main branch M.

Figure 4B:
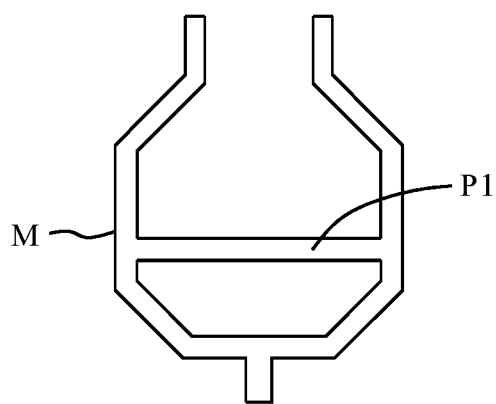
FIG. 4B is a plan view of different current paths of a first secondary conductor of the variable inductor according to an embodiment of the present disclosure.

In FIG. 4B, only the first switch S1 is operated to be closed. The first secondary conductor 120 is formed a single-loop structure with the main branch M and the current path P1.

Figure 4C:
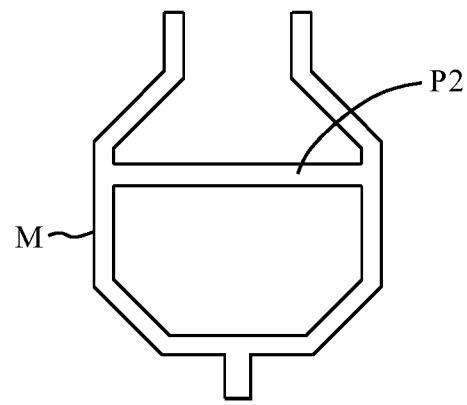
FIG. 4C is a plan view of different current paths of a first secondary conductor of the variable inductor according to an embodiment of the present disclosure.

In FIG. 4C, only the second switch S2 is operated to be closed. The first secondary conductor 120 is formed a single-loop structure with the main branch M and the current path P2.

Figure 4D:
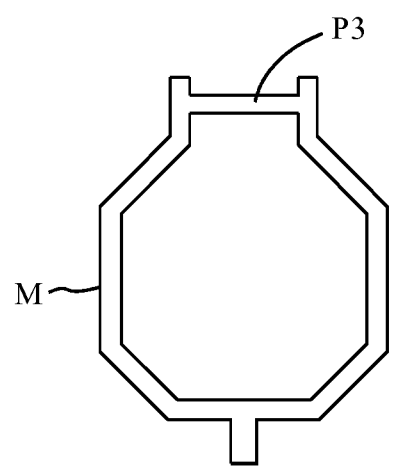
FIG. 4D is a plan view of different current paths of a first secondary conductor of the variable inductor according to an embodiment of the present disclosure.

In FIG. 4D, only the third switch S3 is operated to be closed. The first secondary conductor 120 is formed a single-loop structure with the main branch M and the current path P3.

Figure 4E:
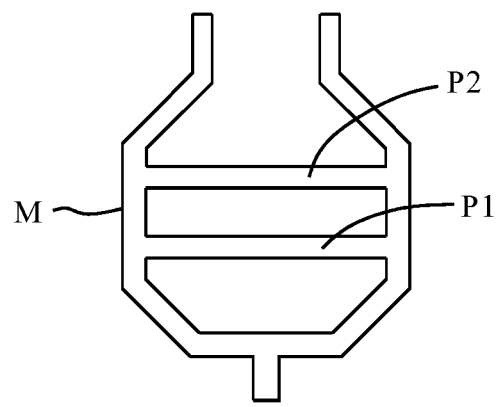
FIG. 4E is a plan view of different current paths of a first secondary conductor of the variable inductor according to an embodiment of the present disclosure.

In FIG. 4E, the first switch S1 and the second switch S2 are operated to be closed. The first secondary conductor 120 is formed a single-loop structure with the main branch M, the current path P1 and the current path P2.

Figure 4F:
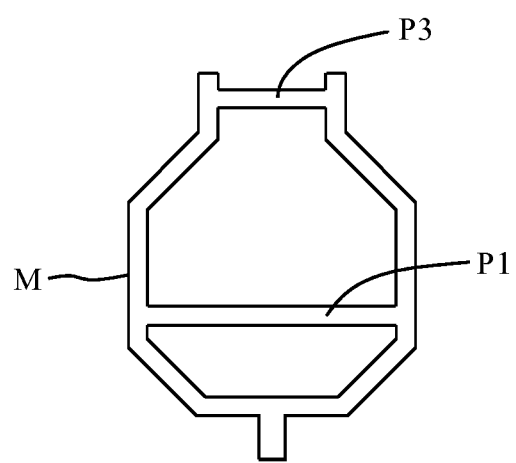
FIG. 4F is a plan view of different current paths of a first secondary conductor of the variable inductor according to an embodiment of the present disclosure.

In FIG. 4F, the first switch S1 and the third switch S3 are operated to be closed. The first secondary conductor 120 is formed a single-loop structure with the main branch M, the current path P1 and the current path P3.

Figure 4G:
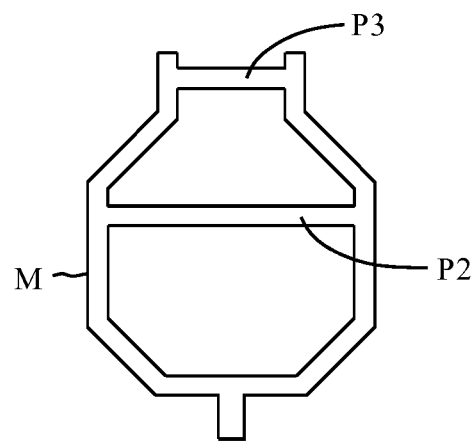
FIG. 4G is a plan view of different current paths of a first secondary conductor of the variable inductor according to an embodiment of the present disclosure.

In FIG. 4G, the second switch S2 and the third switch S3 are operated to be closed. The first secondary conductor 120 is formed a single-loop structure with the main branch M, the current path P2 and the current path P3.

Figure 4H:
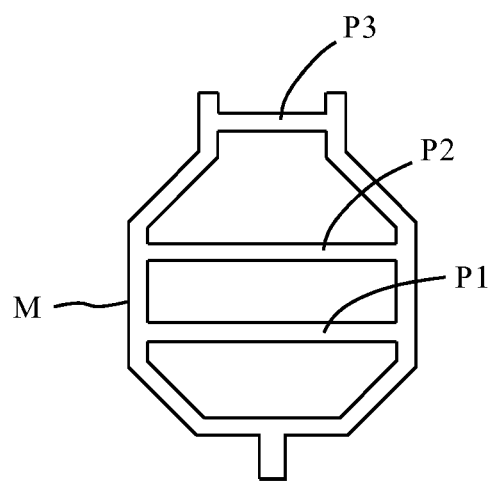
FIG. 4H is a plan view of different current paths of a first secondary conductor of the variable inductor according to an embodiment of the present disclosure.

In FIG. 4H, all of the first switch S1, the second switch S2 and the third switch S3 operated to be closed. The first secondary conductor 120 is formed a single-loop structure with the main branch M, the current path P1, the current path P2 and the current path P3.

Figure 5:
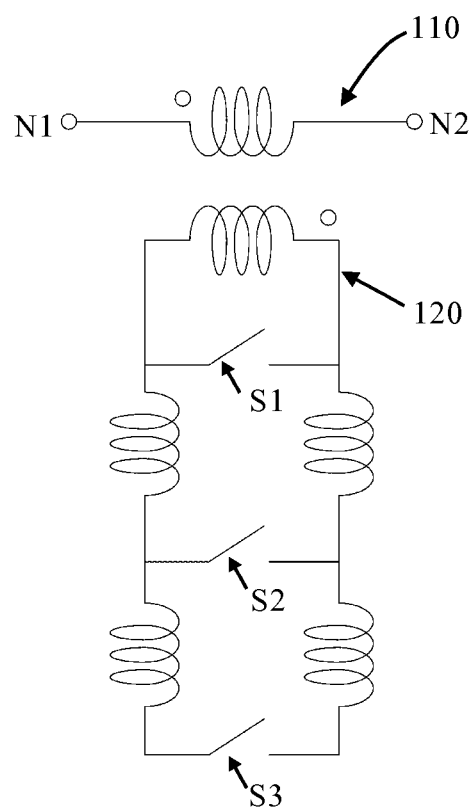
FIG. 5 shows an illustratively equivalent circuit of the variable inductor of FIG. 3.

The first secondary conductor 120 is formed a single-loop structure with eight changeable current paths which are determined by the state of the first switch S1, the second switch S2 and third switch S3. The inductance of the variable inductor 100 is varied by closing and opening the first switch S1, the second switch S2 and the third switch S3. Therefore, in this embodiment, the variable inductor 100 has an adjustable inductance range which includes eight different inductance values corresponding to eight different current paths (as shown as FIG. 4A through 4H), respectively. FIG. 5 is an illustratively equivalent circuit of the variable inductor of FIG. 3. The inductance from the first node N1 through the second node N2 of the primary conductor 110 is changed according to the state of the switch S1 through S3 of the first secondary conductor 120.

Figure 6A:
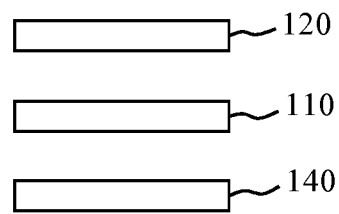
FIG. 6A shows two different arrangements of a variable inductor according to another two embodiments of the present disclosure.
Figure 6B:
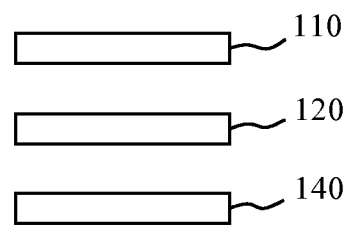
FIG. 6B shows two different arrangements of a variable inductor according to another two embodiments of the present disclosure.

FIGS. 6A and 6B show two different arrangements of a variable inductor according to two embodiments of the present disclosure. In FIG. 6A, the first secondary conductor 120 is disposed on the top of the primary conductor 110, and the substrate or printed circuit board 140 is disposed under the bottom of the primary conductor 110. In FIG. 6B, the first secondary conductor 120 is disposed under the bottom of the primary conductor 110, and the substrate or printed circuit board 140 is disposed under the bottom of first secondary conductor 120.

In other one embodiment, the third switch S3 can be eliminated. In that embodiment, the first secondary conductor 120 is formed a single-loop structure with four changeable current paths which are operated by the states of the first switch S1 and the second switch S2.

In the other one embodiment, both the second switch S2 and the third switch S3 can be eliminated. In that embodiment, the first secondary conductor 120 is formed a single-loop structure with two changeable current paths which are determined by the state of the first switch S1.

In still the other one embodiment, the number of the switches can be $N_1$ and the first secondary conductor 120 is formed a single-loop structure with $M_1$ changeable current paths which are determined by the state of the $N_1$ switches, wherein $N_1$ is more than 3 and $M_1$ is more than 8.

Figure 7:
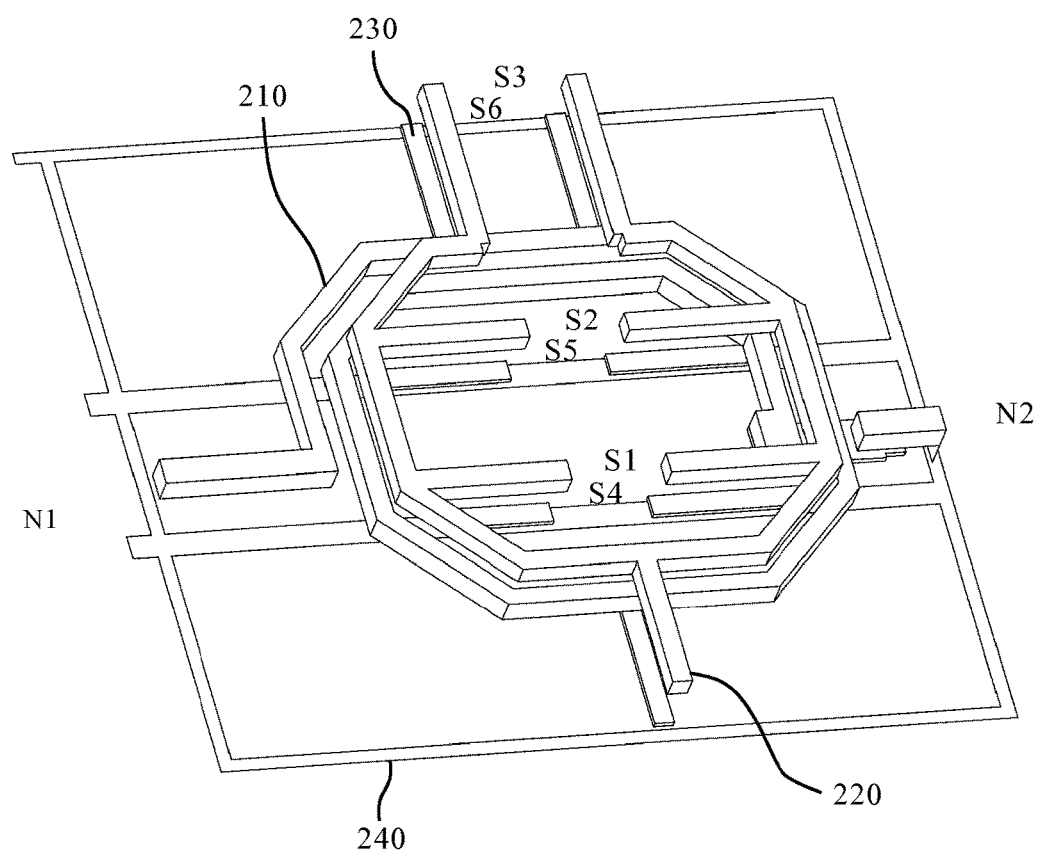
FIG. 7 is schematic diagrams of a variable inductor according to another one embodiment of the present disclosure.

Referring to FIG. 7, FIG. 7 is schematic diagrams of a variable inductor according to another one embodiment of the present disclosure. The variable inductor 200 has a primary conductor 210, a first secondary conductor 220, a second secondary conductor 230, a first switch S1, a second switch S2, a third switch S3, a fourth switch S4, a fifth switch S5 and a sixth switch S6.

In FIG. 7, the second secondary conductor 230 is disposed under the bottom of the primary conductor 210. The fourth switch S4, the fifth switch S5 and the sixth switch S6 can be implemented on a substrate or printed circuit board 240. The printed circuit board 240 can be disposed under the bottom of the primary conductor 210.

The fourth switch S4 has two sides connected to the second secondary conductor 230, respectively. The fifth switch S5 has two sides connected to the second secondary conductor 230, respectively. The sixth switch S6 has two sides connected to the second secondary conductor 230, respectively. The fourth switch S4, the fifth switch S5 and the sixth switch S6 are formed on another three current paths, respectively.

The second secondary conductor 230 is formed a single-loop structure. The three current paths are formed as three different bypaths of the single-loop structure. Therefore, if the state of anyone of the fourth switch S4, the fifth switch S5 and the sixth switch S6 are changed, then the current paths of the second secondary conductor is changed.

The structure of the first secondary conductor 220 and the second secondary conductor 230 are roughly the same as the structure of the first secondary conductor 120. Therefore, the detailed description of the first secondary conductor 220 and the second secondary conductor 230 is omitted.

Figure 8:
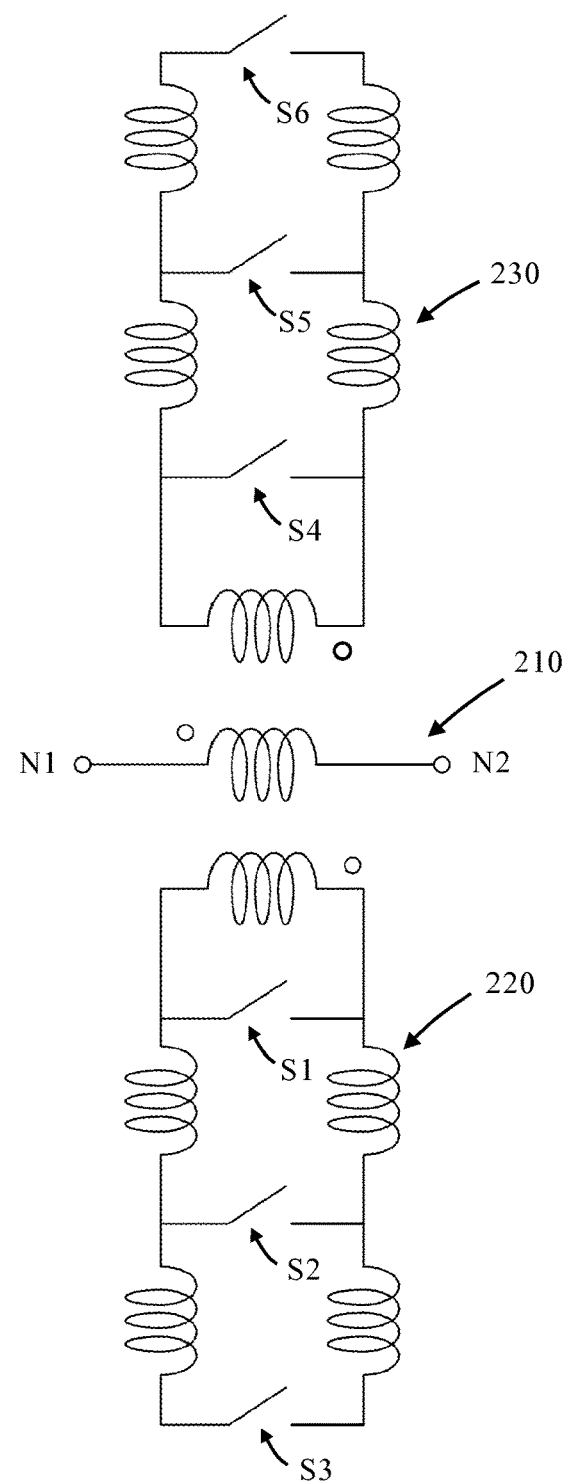
FIG. 8 shows an illustratively equivalent circuit of the variable inductor of FIG. 7.

The first secondary conductor 220 is formed a single-loop structure with eight changeable current paths which are determined by the state of the first switch S1, the second switch S2 and third switch S3. The second secondary conductor 230 is also formed a single-loop structure with eight changeable current paths which are determined by the state of the fourth switch S4, the fifth switch S5 and the sixth switch S6. The inductance of the variable inductor 200 is varied by closing and opening the first switch S1, the second switch S2, the third switch S3, the fourth switch S4, the fifth switch S5 and the sixth switch S6. Therefore, in this embodiment, the variable inductor 200 has an adjustable inductance range which includes 64 different inductance values corresponding to 8*8 different current paths, respectively. FIG. 8 is an illustratively equivalent circuit of the variable inductor of FIG. 7.

Figure 9A:
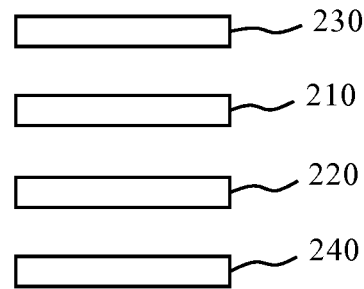
FIG. 9A shows two different arrangements of a variable inductor according to two embodiments of the present disclosure.
Figure 9B:
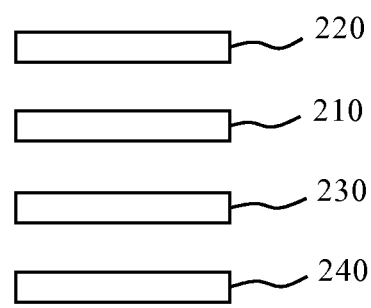
FIG. 9B shows two different arrangements of a variable inductor according to two embodiments of the present disclosure.

FIGS. 9A and 9B show two different arrangements of a variable inductor according to two embodiments of the present disclosure. In FIG. 9A, the second secondary conductor 230 is disposed on the top of the primary conductor 210, the first secondary conductor 220 is disposed under the bottom of the primary conductor 210, and the printed circuit board 240 is disposed under the bottom of the first secondary conductor 220. In FIG. 9B, the first secondary conductor 220 is disposed on the top of the primary conductor 210, the second secondary conductor 230 is disposed under the bottom of the primary conductor 210, and the printed circuit board 240 is disposed under the bottom of the second secondary conductor 230.

In other one embodiment, the sixth switch S6 can be eliminated. In that embodiment, the second secondary conductor 230 is formed a single-loop structure with four changeable current paths which are operated by the states of the fourth switch S4 and the fifth switch S5.

In the other one embodiment, both the fifth switch S5 and the sixth switch S6 can be eliminated. In that embodiment, the second secondary conductor 230 is formed a single-loop structure with two changeable current paths which are determined by the state of the fourth switch S4.

In still the other one embodiment, the number of the switches can be $N_2$ and the second secondary conductor 230 is formed a single-loop structure with $M_2$ changeable current paths which are determined by the state of the $N_2$ switches, wherein $N_2$ is more than 3 and $M_2$ is more than 8.

The variable inductor is suitable for being integrated in an integrated circuit, for example, a radio frequency integrated circuit. A first node $N_1$ of the variable inductor can be disposed on one end of the primary conductor of the variable inductor and a second node $N_2$ of the variable inductor can be disposed on another end of the primary conductor of the variable inductor. The first node $N_1$ can connect to a first external component, for example, a first component of the integrated circuit. The second node $N_2$ can connect to a second external component, for example, a second component of the integrated circuit.

Figure 10:
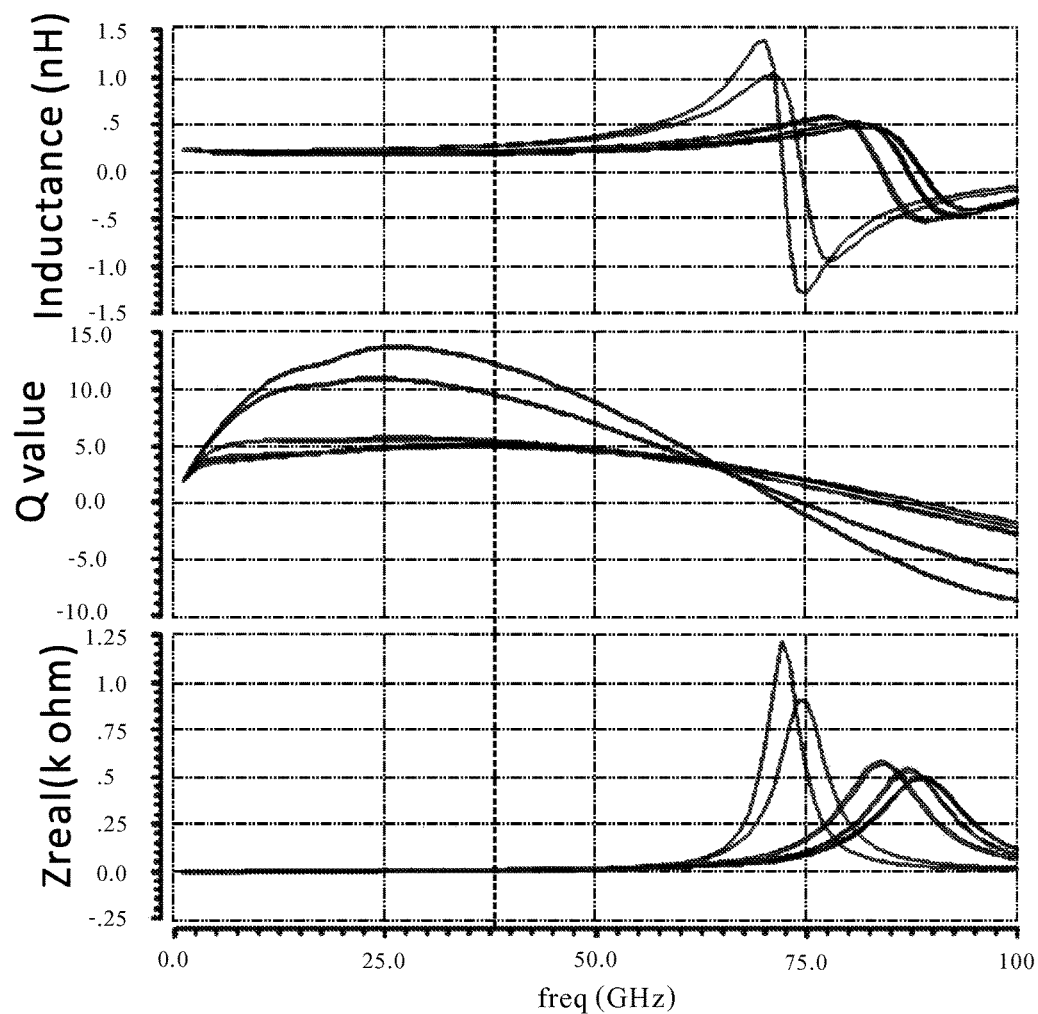
FIG. 10 shows a simulation result of FIG. 3.

Referring to FIG. 10, FIG. 10 shows a simulation result of FIG. 3. In FIG. 10, three switches are implemented by 28 nm CMOS (complementary metal oxide semiconductor). The adjustable inductance range is 187 pH-277 pH.

In conclusion, the aforesaid variable inductor and integrated circuit, the present disclosure feature a wider adjustable inductance range, a better inductance resolution, a higher Q value, fewer durability issues or no bias concern.

The present disclosure is disclosed above by preferred embodiments. However, persons skilled in the art should understand that the preferred embodiments are illustrative of the present disclosure only, but should not be interpreted as restrictive of the scope of the present disclosure. Hence, all equivalent modifications and replacements made to the aforesaid embodiments should fall within the scope of the present disclosure. Accordingly, the legal protection for the present disclosure should be defined by the appended claims.

What is claimed is:

1. A variable inductor being used to connect a first external component and a second external component, the variable inductor comprising:
   a primary conductor having a first node and a second node, the first node being used to connect the first external component, the second node being used to connect the second external component;
   a first secondary conductor, magnetically coupling to the primary conductor;
   a second secondary conductor magnetically coupling to the primary conductor;
   a first switch having two sides connected to the first secondary conductor, respectively;
   a second switch having two sides connected to the first secondary conductor, respectively;
   a third switch having two sides connected to the first secondary conductor, respectively; and
   a fourth switch having two sides connected to the second secondary conductor, respectively;
   wherein the first secondary conductor is formed a single-loop structure with eight changeable current paths which are operated by the states of the first, second and third switches and the second secondary conductor is formed a single-loop structure with two changeable current paths which are operated by the states of the fourth switch.

2. The variable inductor of claim 1 further comprises a fifth switch having two sides connected to the second secondary conductor, respectively, and the second secondary conductor is formed a single-loop structure with four changeable current paths which are operated by the states of the fourth and fifth switches.

3. The variable inductor of claim 2 further comprises a sixth switch having two sides connected to the second secondary conductor, respectively, and the second secondary conductor is formed a single-loop structure with eight changeable current paths which are operated by the states of the fourth, fifth and sixth switches.

4. The variable inductor of claim 3, wherein the first secondary conductor is disposed on one side of the primary conductor and the second secondary conductor is disposed on another side of the primary conductor.

5. An integrated circuit comprising:
   a first component;
   a second component; and
   a variable inductor connected the first component and the second component,
   wherein the variable inductor comprise a primary conductor, a first secondary conductor, a second secondary conductor, a first switch, a second switch, a third switch and a fourth switch, the primary conductor has a first node and a second node, the first node connects to the first external component, the second node connects to the second external component, the first secondary conductor magnetically couples to the primary conductor, the second secondary conductor magnetically couples to the primary conductor, the first switch has two sides connected to the second inductor element, respectively, the second switch having two sides connected to the first secondary conductor, respectively, the third switch having two sides connected to the first secondary conductor, respectively, the first secondary conductor is formed a single-loop structure with eight changeable current paths which are operated by the states of the first, second and third switches, and the second secondary conductor is formed a single-loop structure with two changeable current paths which are operated by the states of the fourth switch.

6. The integrated circuit of claim 5, wherein the variable inductor further comprises a fifth switch having two sides connected to the second secondary conductor, respectively, and the second secondary conductor is formed a single-loop structure with four changeable current paths which are operated by the states of the fourth and fifth switches.

7. The integrated circuit of claim 6, wherein the variable inductor further comprises a sixth switch having two sides connected to the second secondary conductor, respectively, and the second secondary conductor is formed a single-loop structure with eight changeable current paths which are operated by the states of the fourth, fifth and sixth switches.

8. The integrated circuit of claim 7, wherein the first secondary conductor is disposed on one side of the primary conductor and the second secondary conductor is disposed on another side of the primary conductor.

\* \* \* \* \*